(12) United States Patent
Koenck

(10) Patent No.: US 7,125,743 B2
(45) Date of Patent: Oct. 24, 2006

(54) METHOD FOR REDUCTION OF ELECTROMAGNETIC INTERFERENCE IN INTEGRATED CIRCUIT PACKAGES

(75) Inventor: Steven E. Koenck, Cedar Rapids, IA (US)

(73) Assignee: Intermec IP Corp., Everett, WA (US)

( * ) Notice: Subject to any disclaimer, the term of this patent is extended or adjusted under 35 U.S.C. 154(b) by 0 days.

(21) Appl. No.: 10/684,072

(22) Filed: Oct. 13, 2003

(65) Prior Publication Data

US 2004/0075175 A1    Apr. 22, 2004

Related U.S. Application Data

(62) Division of application No. 10/040,256, filed on Dec. 31, 2001, now abandoned, which is a division of application No. 09/068,685, filed as application No. PCT/US96/17916 on Nov. 15, 1996.

(60) Provisional application No. 60/006,755, filed on Nov. 15, 1995.

(51) Int. Cl.
*H01L 21/44*    (2006.01)
(52) U.S. Cl. ...................................... 438/106

(58) Field of Classification Search ................ 438/106, 438/124, 15, 26, 64, 55, 126, 107, 108
See application file for complete search history.

(56) References Cited

U.S. PATENT DOCUMENTS 5,703,396 A * 12/1997 Kurihara ..................... 257/692
6,822,438 B1 * 11/2004 Van Horn et al. ........ 324/158.1

* cited by examiner

*Primary Examiner*—Howard Weiss
*Assistant Examiner*—(Vikki) Hoa B. Trinh

(57) ABSTRACT

EMI radiation in an integrated circuit device package (10) is reduced or eliminated by the introduction of a magnetic material into the encapsulating medium (14). The permeance of the magnetic encapsulating medium (14) affects the inherent series inductance of the lead frame conductors (16) to thereby reduce electromagnetic interference. Ferrite microbeads (30) are formed around the lead frame conductors (16) to contain the magnetic flux (32) generated by an electrical current signal and to attenuate the effects of mutual inductance.

5 Claims, 5 Drawing Sheets

US 7,125,743 B2

METHOD FOR REDUCTION OF ELECTROMAGNETIC INTERFERENCE IN INTEGRATED CIRCUIT PACKAGES

CROSS REFERENCE TO RELATED APPLICATIONS

This application is a division of U.S. application Ser. No. 10/040,256 filed Dec. 31, 2001 now abandoned, which is a division of U.S. application Ser. No. 09/068,685 filed May 13, 1998 now abandoned, which was the National Stage of International Application No. PCT/US 96/17916 filed Nov. 15, 1996, published in English as WO 97/18586 dated May 22, 1997, which claimed the benefit of U.S. Provisional Application No. 60/006,755 filed Nov. 15, 1995.

BACKGROUND OF THE INVENTION

The present invention relates generally to reduction of electromagnetic interference and specifically to reduction of electromagnetic interference generated within an integrated circuit device package.

Advents in the performance of microcomputer based electronics have resulted in dramatic increases in operating speeds of the logic switching circuits. Increased switching and operating speeds correspond to increased bandwidths of the electronic signals transmitted within the interior of an electronic device which become a significant source for electromagnetic radiation causing interference with the internal circuitry of the device itself and with other electronic devices operating within the vicinity of the device. The electromagnetic radiation emitted at these higher frequencies may cause undesirable electromagnetic coupling between data paths resulting in cross channel interference.

The amount of internally generated electromagnetic radiation must be limited to the guidelines and regulations set by governmental agencies such as the FCC in the United States and CISPR in European countries. Sources of electromagnetic radiation originating externally to the device may also affect and interfere with the operation of the device. In general the problems resulting form unwanted electromagnetic radiation are classified as electromagnetic interference (EMI).

A recurring observation in the analysis of EMI performance in products that use VLSI integrated circuits is that there is a significant amount of emission radiated directly from the integrated circuit package itself before the signal connections from the device are available on an external pin. This is particularly evident in devices that have a large number of pins, such as a common 208 pin Quad Flat Pack (QFP) device. A 208 pin QFP device is typically on the order of 1 inch square with the actual integrated circuit itself occupying only a small amount of the real estate of the QFP package. Typically, the integrated circuit (IC) is relatively small being on the order of 0.2 square winches to 0.3 square inches. As a result, there must be internal conductor leads from the IC silicon wafer to the external pins of the device. This is typically implemented with a lead frame of metal strips etched or stamped from a sheet of material to support the integrated circuit chip and to provide a signal path for the input and output (I/O) pins of the QFP device.

In such a design there may be a significant conductor length from the IC itself through the bonding wires and the lead frame conductors to the external pins of the device. This is especially true for pins at or near the corner of the device, in which case the conductor lead length may be well over 0.5 inch.

The described physical lead lengths in typical integrated circuit packaging designs generally cause two problems. The problem is mid and high frequency signal degradation introduced by the inherent series inductance of the conductor leads which is particularly a problem for the power and ground feeds. The second problem is that the conductor leads may radiate EMI energy as an antenna thereby interfering with the signals an adjacent conductor leads in the package and with other signal paths and components in the electronic device in which the integrated circuit is utilized. The techniques known in the art for reducing electromagnetic interference are effective only external to the integrated circuit device package. Thus, there lies a need for a method and apparatus to reduce or eliminate electromagnetic radiation internal to the integrated circuit device package itself.

SUMMARY OF THE INVENTION

The present invention provides reduction and elimination of electromagnetic radiation in an integrated circuit. The electromagnetic radiation is reduced or eliminated, and electrical signals internal to the integrated circuit package are conditioned internally within the integrated circuit package itself.

BRIEF DESCRIPTION OF THE SEVERAL VIEWS OF DRAWINGS

The numerous objects and advantages of the present invention may be better understood by those skilled in the art by reference to the accompanying figures in which.

DETAILED DESCRIPTION OF EXEMPLARY EMBODIMENTS

Figure 1:
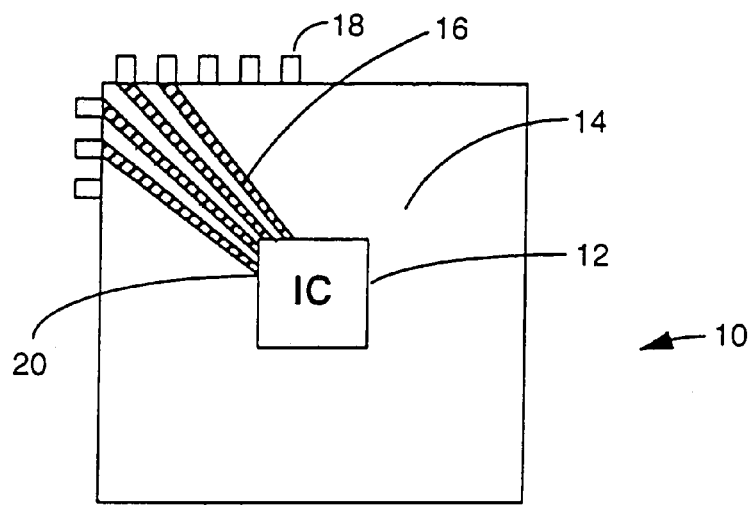
FIG. 1 is a somewhat diagrammatic representation of the internal design of a typical integrated circuit package.

FIG. 1 illustrates the model of a typical Quad Flat Pack (QFP) integrated circuit device. The Quad Flat Pack may comprise a 1.0 inch square integrated circuit device package 10. The integrated circuit (IC) 12 itself may only comprise a 0.2 inch square or 0.3 inch square wafer of silicon containing the actual integrated circuitry of the integrated circuit package 10. The device package 10 is formed by encapsulating the integrated circuit 12 in a plastic medium 14 which defines the physical dimensions of the device package 10. The plastic medium 14 protects and supports the integrated circuit 12 and contains the lead frame conductors 16 which electrically connect the IC 12 to the external input/output (I/O) pins 18 of the device package 10. The lead frame conductors 16 connect to the IC 12 via bonding wires 20 which directly connect to strategic circuitry nodes on the IC 12.

Figure 2:
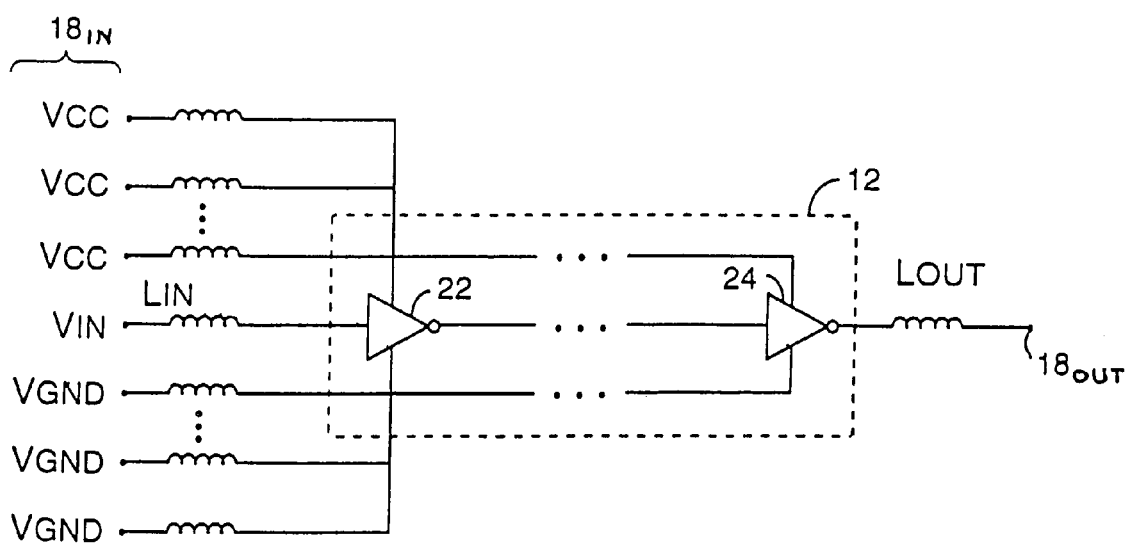
FIG. 2 is a schematic illustration of the electrical model of a typical integrated circuit device package.

FIG. 2 illustrates the electrical model of the typical integrated circuit package of FIG. 1. FIG. 2 illustrates how the lead frame conductors 16 from the I/O pins 18 to the integrated circuit 12 are not ideal transmission lines but in practice exhibit a per length series inductance. Longer lengths of the lead frame conductors 16 result in larger values of the inherent series inductance. Input leads of the lead frame conductors 16 connect the input pins $18_{IN}$ of the I/O pins 18 to input buffers such as 22 on the integrated circuit 12, and output leads of the lead frame conductors 16 connect the output pin $18_{OUT}$ of the I/O pins 18 to output buffers such as 24 on the integrated circuit 12. In general, the input and output conductor leads of the lead frame conductors 16 exhibit input series inductance $L_{IN}$ and output series inductance $L_{OUT}$.

Ideally, the inductance of the $V_{CC}$ and $V_{GND}$ leads would be zero henries. In a preferred embodiment of the present invention the effective inductance of the $V_{CC}$ and $V_{GND}$ leads is effectively reduced with multiple parallel branches since there are typically multiple $V_{CC}$ and $V_{GND}$ pins in a given integrated circuit device package 10. Utilization of multiple signal paths to reduce the effective inductance of a data signal path provided by a lead frame conductor 16 is not feasible; therefore the effective series inductances $L_{IN}$ and $L_{OUT}$ of the lead frame conductors 16 preferably exhibit a small amount of "lossy" inductance. By making the series inductance of lead frame conductors 16 lossy, the detrimental EMI effects of the series inductances may be thereby reduced.

Given the construction of the lead frame which provides the lead frame conductors 16, the packaging function for the integrated circuit 12 is preferably completed by placing the lead frame with bonded integrated circuit 12 into an injection molding cavity where molten plastic is injected to encapsulate the lead frame and integrated circuit 12 to form the device package 10. The plastic material 14 is preferably electrically passive and electrically non-conducting so that it will cause no degradations of the electrical signals to and from the integrated circuit 12.

In a preferred embodiment of the present invention a modeled plastic material 14 having desired electromagnetic properties to advantageously affect the signals to and from the integrated circuit 12 as the signals are routed through the lead frame conductors 16 of the device is utilized. A small amount of ferrite powder is preferably blended with the plastic material 14 to achieve the slightly lossy magnetic characteristic of the encapsulating plastic medium 14 surrounding the lead frame conductors 16. Ferrite is preferred because of its high resistivity and permeability.

Figure 3:
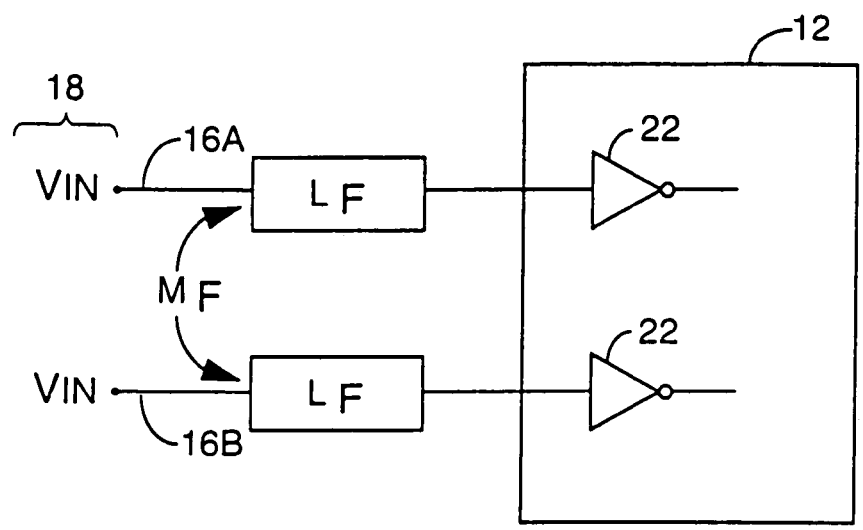
FIG. 3 is a somewhat schematic illustration of the electrical model of an integrated circuit device package utilizing the present invention.

FIG. 3 illustrates the effects of the introduction of ferrite powder into the encapsulating plastic of the integrated circuit device package of FIG. 1. The introduction of a ferrite material into the encapsulating plastic 14 alters the permeance of the encapsulating medium 14 and thereby affects the electrical characteristics of the inherent series impedance of the lead frame conductors 16. The ferrite material in the encapsulating medium 14 causes the series inductance of the lead frame conductors 16A and 16B to behave as a lossy inductor $L_F$. Further, the ferrite material contributes to the mutual inductance $M_F$ and resulting coupling primarily associated with adjacent lead frame conductors 16A and 16B. The ferrite material exhibits hysteresis loss, but because ferrite has high characteristic resistivity, it exhibits no eddy-current loss. Increasing the permeance of the physical medium 14 surrounding the inductance with the presence of a magnetic material such as ferrite produces an effect opposite to the effect resulting with magnetic core inductors; instead of concentrating the magnetic flux within the center of the inductor to thereby augment the effective inductance as with a magnetic core, the increased permeance of the surrounding medium 14 due to the magnetic material tends to distribute the flux throughout the medium away from the inductor thereby attenuating the effective inductance.

Figure 4:
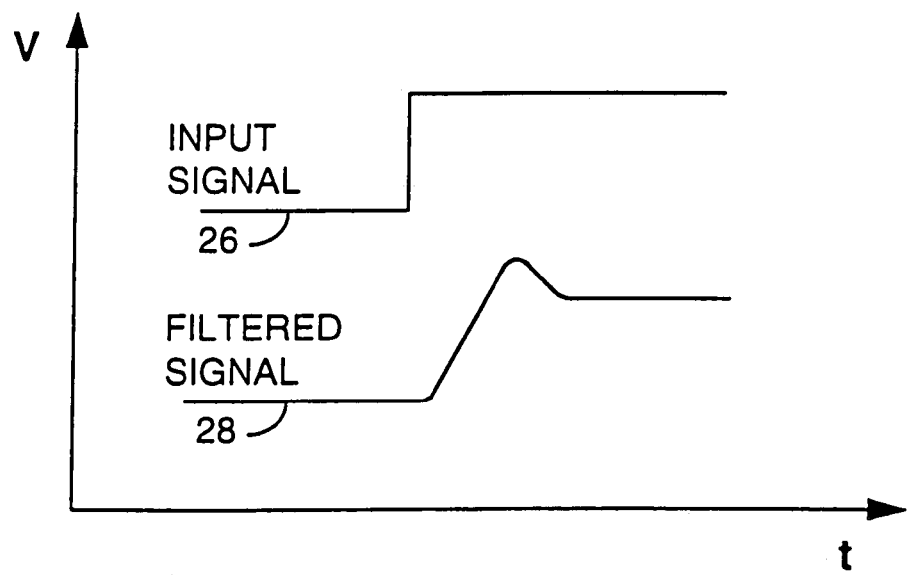
FIG. 4 illustrates the resulting characteristic curve of the electrical signals conditioned by the present invention.

FIG. 4 illustrates the resulting preferred characteristic signal shape of a given data signal when a ferrite material is introduced into the encapsulating medium. The lossy inductor $L_F$ as shown in FIG. 3 would serve to attenuate only the highest frequency signal components while introducing generally little true inductance effects of overshoot and ringing associated with the series inductance of the lead frame conductors 16 when no ferrite is present. The Q of the inherent series inductance of the lead frame conductors 16 is thereby minimized rather than maximized. Thus, the intentionally introduced inductor loss reduces the undesired effects of the inherent series inductance such as overshoot and ringing.

Figure 5:
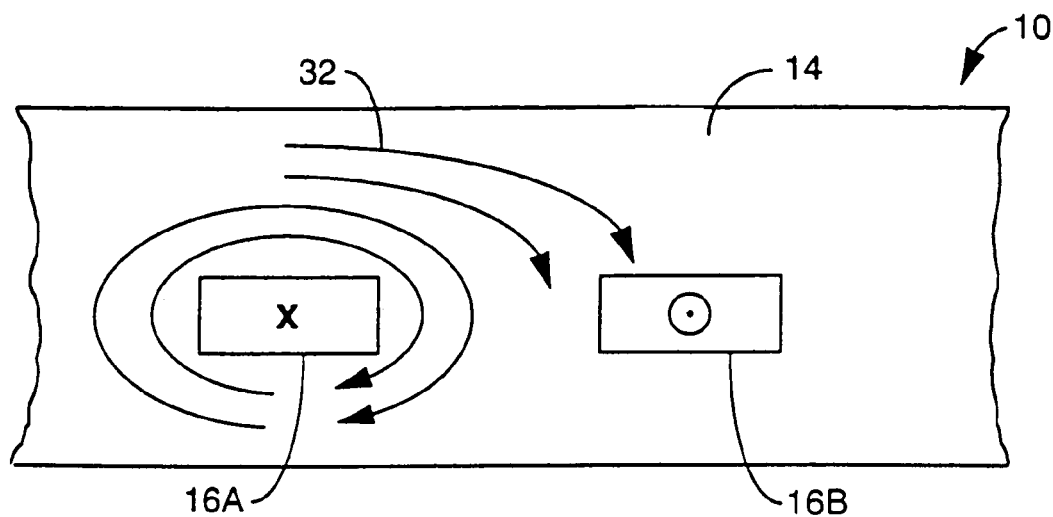
FIG. 5 is a schematic elevation view of an integrated circuit device package of the present invention illustrating the magnetic flux pattern occurring therein.

FIG. 5 illustrates a two conductor mutual coupling model of the present invention. Introduction of mutual coupling and signal crosstalk between two adjacent lead frame conductors 16A and 16B would be an undesirable effect that is preferably minimized. Current flowing into conductor 16A introduces magnetic flux 32 through adjacent conductor 16B thereby inducing a current therein. In a preferred embodiment of the present invention a relatively small amount of ferrite material is blended in the encapsulating plastic 14 resulting in a relative permeability of the surrounding material 14 that is not too high to cause significant mutual coupling but yet sufficient to desirably affect the series inductance of the lead conductors 16. In a preferred embodiment of the present invention, the relative permeability of the encapsulating medium 14 ranges from 5 to 10.

Regarding the two conductor mutual coupling example as shown in FIG. 3, the actual amount of mutual inductance $M_F$ between two adjacent lead frame conductors 16A and 16B is small with respect to the self-inductance $L_F$ of each conductor 16. In a preferred embodiment of the present invention, the reduction of crosstalk on any particular lead frame conductor 16 may be further achieved by placing that particular lead frame conductor 16 adjacent to a $V_{CC}$ or $V_{GND}$ lead to avoid any coupling to another data signal path.

Figure 6:
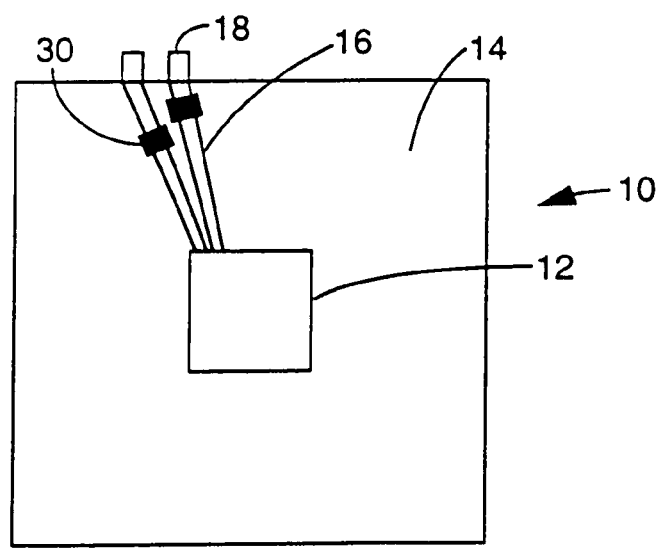
FIG. 6 is a somewhat diagrammatic representation of the internal design of an integrated circuit device package utilizing the present invention.

FIG. 6 illustrates a preferred embodiment of the present invention in which mutual coupling between adjacent leads is eliminated. The virtual elimination of the mutual inductance may be achieved by molding the device package 10 in two steps. The first step preferably comprises constructing the lead frame which provides lead frame conductors 16 and then forming or molding individual ferrite "microbeads" 30 on each lead frame conductor 16. The microbeads 30 are preferably offset so they do not interfere with adjacent microbeads 30. The microbead 30 are electrically isolated from the adjacent lead frame conductors 16.

In a preferred embodiment of the present invention the microbeads 30 are made of pure ferrite material which may be constructed using known ceramic techniques, and the microbeads 30 would be formed as an integral part of the lead frame 16. The microbeads 30 are utilized in a manner analogous to the utilization of ferrite bead chokes in radiofrequency transmission lines and antennas. The bead surrounds the transmission line and effectively chokes undesired high frequency signals immediately external to the transmission line that are the source of electromagnetic interference without affecting data signals passing therethrough.

The second step preferably comprises ordinary plastic encapsulation of the lead frame that provides lead frame conductors 16 and the integrated circuit 12 upon completion of the bonding and wiring of the IC 12 to the lead frame. In an alternative embodiment of the present invention the inclusion of a ferrite microbead 30 on any given lead frame conductor 16 is optional depending upon the type of signal transmitted thereon. For example, $V_{CC}$ and $V_{GND}$ signals perform better if there is no ferrite bead 30 on those leads. In a preferred embodiment, the standard lead frame is constructed with a microbead 30 on each lead frame conductor 16. Microbeads 16 may be selectively removed by crushing away the undesired beads 30 which is facilitated by the inherent brittleness of ferrite. Preferably, a simple press may be utilized having small crushing pins arranged above the corresponding microbeads to be crushed in which all undesired microbeads 30 may be removed in a single step.

Figure 7:
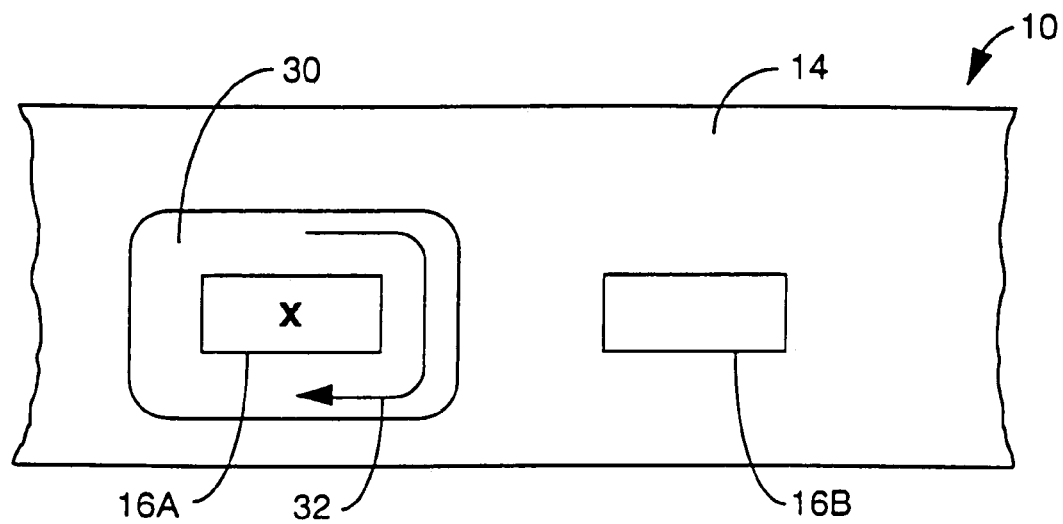
FIG. 7 is a schematic elevation view of an integrated circuit device package of a preferred embodiment of the present invention illustrating the magnetic flux pattern occurring therein.

FIG. 7 illustrates a preferred embodiment of the present invention in which the magnetic flux is contained within the ferrite beads. The ferrite bead 30 surrounding conductor 16A completely contains the magnetic flux 32 generated by the current flowing into conductor 16A. Thus, no current is induced in conductor 16B from the magnetic flux 32 created by the current flowing through conductor 16A. In a preferred embodiment of the present invention, only the microbeads 30 contain ferrite wherein the encapsulating medium 14 entirely comprises nonmagnetic plastic. Alternatively, a small amount of ferrite may be blended in with the encapsulating plastic 14 in conjunction with the utilization of ferrite beads to further achieve the reduction of electromagnetic interference.

Figure 8:
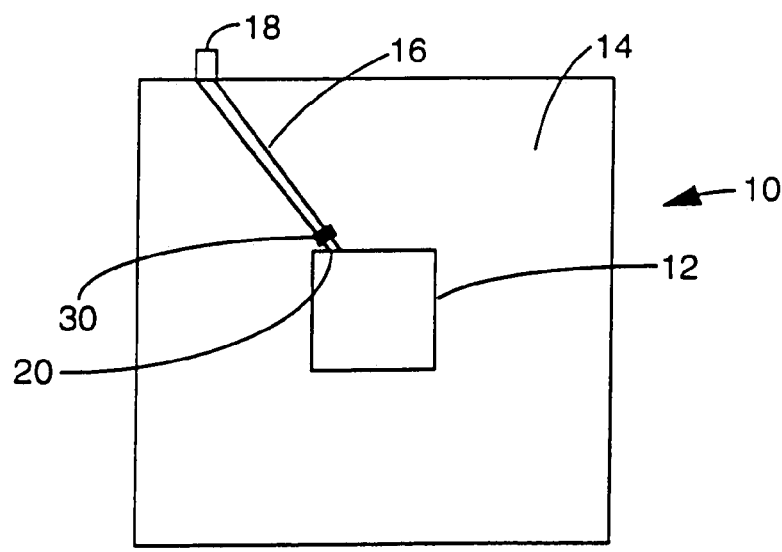
FIG. 8 is a somewhat diagrammatic representation of the internal design of an integrated circuit device package utilizing a preferred embodiment of the present invention.

FIG. 8 illustrates the preferred placement of the ferrite beads of the present invention relative to the integrated circuit wafer in the device package. The most effective physical location for the microbeads 30 is as near to the integrated circuit 12 as possible. With the required close spacing of the lead frame conductors 16 near the IC bonding pads 20, the physical size of a microbead 30 may not be very large, however the effects of the reduced size are offset by the fact that the placement of the ferrite microbead 30 near the IC 12 is nearly ideal.

Figure 9:
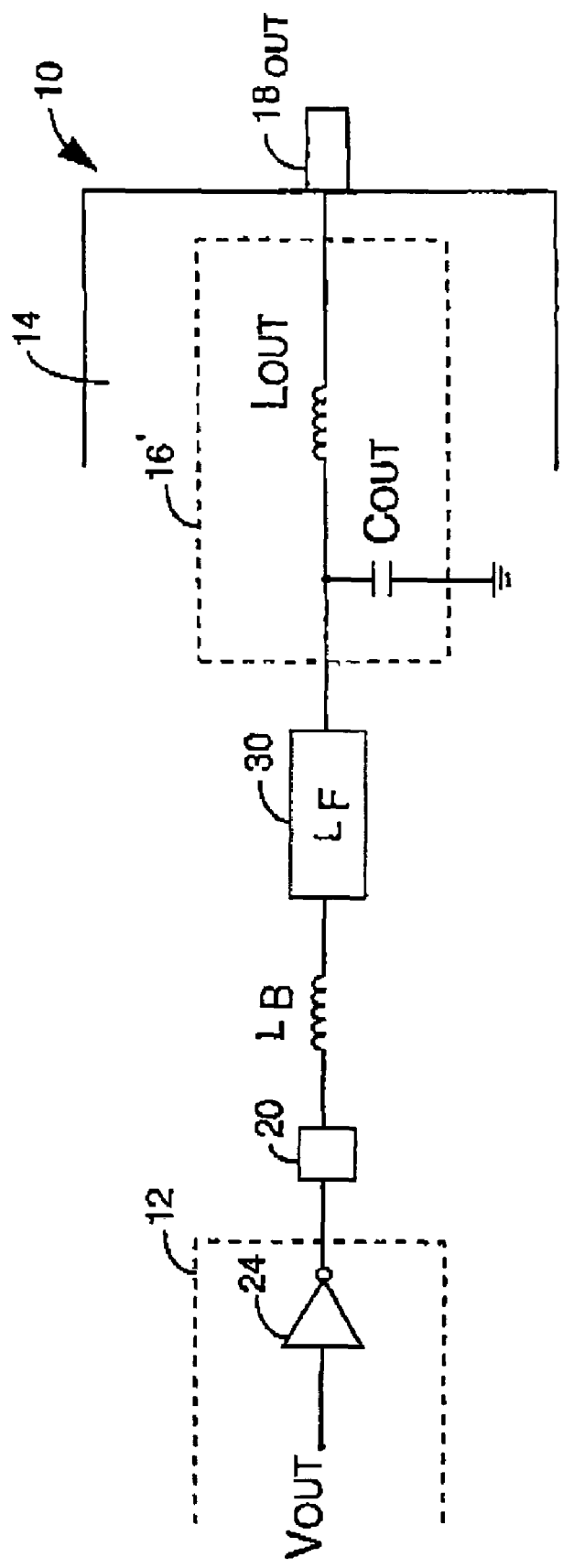
FIG. 9 is an electrical schematic diagram of the equivalent circuit model of a preferred embodiment of the present invention.

FIG. 9 illustrates the resulting electrical circuit model of a given conductor path in an integrated circuit device package of the present invention including an equivalent circuit model 16' for representing a typical lead frame conductor 16. An output signal $V_{OUT}$ from the integrated circuit 12 feeds into an output buffer 24 which is externally connected through an IC bonding wire pad 20. The bonding wire 20 exhibits a small series inductance $L_B$ which is small relative to the inductance $L_F$ of the ferrite microbead 30. The lead frame conductor 16 exhibits a characteristic lumped series inductance $L_{OUT}$ and shunt capacitance $C_{OUT}$, the effects of which are negligible compared to the inductance $L_{OUT}$ of the microbead 30, and extends through the encapsulating medium 14. The effects of inductance $L_{OUT}$ and capacitance $C_{OUT}$ may be further reduced by the blending of ferrite with the encapsulation material 14. The lead frame conductor 16 connects to an external pin $18_{OUT}$ on the exterior of the device package 10.

In view of the above description of a preferred embodiment and modifications thereof, various other modifications will now become apparent to those skilled in the art. The contemplation of the invention below encompasses the disclosed embodiments and all reasonable modifications and variations without departing from the spirit and scope of the invention.

The invention claimed is:

1. The method of reducing electromagnetic interference generated within an integrated circuit device package wherein the integrated circuit device package comprises
   a wafer having wafer circuitry disposed thereon;
   a plurality of conductors defining electrically conductive paths for carrying the electric current flowing to and from the wafer circuitry; and
   a structure that encapsulates and supports the wafer, said structure comprises an encapsulating medium; said method comprising introducing into the encapsulating medium a powder composed of ferrite magnetic material that exhibits a hysteresis loss, in the vicinity of at least one of the electrically conductive paths such that the ferrite magnetic material does not itself prevent bending of the at least one of the electrically conductive paths, but serves to attenuate the highest frequency signal components while introducing generally little inductance effects of overshoot and ringing associated with the series inductance of the at least one of the electrically conductive paths.

2. The method of claim 1, wherein said method further comprises introducing the powder composed of ferrite magnetic material that exhibits a hysteresis loss characteristic into the encapsulating medium such that the powder composed of ferrite magnetic material does not carry any of the electric current flowing to and from the wafer circuitry, but serves to cause the series inductance of the at least one of the electrically conductive paths to behave as a lossy inductor so as to attenuate the highest frequency signal components while introducing generally little inductance effects of overshoot and ringing.

3. The method of claim 2, wherein a relatively small amount of the powder composed of ferrite magnetic material that exhibits a hysteresis loss characteristic is introduced into the encapsulating medium such that the magnetic material does not carry any of the electric current flowing to and from the wafer circuitry, but so that the relative permeability in the vicinity of the at least one of the electrically conductive paths is not so high as to cause significant mutual coupling with other of the plurality of conductors.

4. The method of claim 3, where the introduction of the relatively small amount of the powder composed of ferrite magnetic material that exhibits a hysteresis loss characteristic is such that the magnetic material does not carry any of the electric current flowing to and from the wafer circuitry, but results in a relative permeability of the encapsulating medium that is sufficient to desirably affect the series inductance of at least one of the electrically conductive paths.

5. The method of claim 3, where the mutual inductance between the one of the plurality of electrically conductive paths and an adjacent conductor is small with respect to the self-inductance of each conductor.

* * * * *